(12) United States Patent
Song et al.

(10) Patent No.: US 12,015,297 B2
(45) Date of Patent: Jun. 18, 2024

(54) BATTERY CHARGING/DISCHARGING CONTROL DEVICE AND METHOD FOR CONTROLLING SAME

(71) Applicant: SAMSUNG SDI CO., LTD., Yongin-si (KR)

(72) Inventors: Yongheui Song, Yongin-si (KR); Yoonphil Eo, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 0 days.

(21) Appl. No.: 17/694,459

(22) Filed: Mar. 14, 2022

(65) Prior Publication Data

US 2022/0200305 A1 Jun. 23, 2022

Related U.S. Application Data

(62) Division of application No. 16/091,472, filed as application No. PCT/KR2017/002963 on Mar. 20, 2017, now Pat. No. 11,309,728.

(30) Foreign Application Priority Data

Apr. 12, 2016 (KR) ........................ 10-2016-0044913

(51) Int. Cl.
  *H02J 7/00* (2006.01)

(52) U.S. Cl.
  CPC ............ *H02J 7/00712* (2020.01); *H02J 7/00* (2013.01); *H02J 7/0048* (2020.01); *H02J 7/005* (2020.01);

(Continued)

(58) Field of Classification Search
USPC .................................................. 320/132, 134
See application file for complete search history.

(56) References Cited

U.S. PATENT DOCUMENTS

| 5,789,903 A | 8/1998 | Young et al. |
| 6,127,810 A | 10/2000 | Sato et al. |

(Continued)

FOREIGN PATENT DOCUMENTS

| CN | 1148908 A | 4/1997 |
| CN | 1504010 A | 6/2004 |

(Continued)

OTHER PUBLICATIONS

Chinese Office Action Corresponding to Application Serial No. 201780020150.0, dated Jan. 20, 2021, 7 pages.

(Continued)

*Primary Examiner* — Samuel Berhanu
(74) *Attorney, Agent, or Firm* — Lewis Roca Rothgerber Christie LLP

(57) ABSTRACT

A charge and discharge control device of a battery charges the battery with a constant current in a constant current mode. When the voltage of the battery corresponds to an end-of-charge voltage, the charge and discharge control device converts the constant current mode to a constant voltage mode and thereby charges the battery with a constant voltage. The end-of-charge voltage is set as a first end-of-charge voltage minus a negative electrode threshold potential from the full-charge voltage of the battery, and the negative electrode threshold potential is a potential value of the negative electrode where a negative electrode active material contained in the battery causes a phase change.

8 Claims, 8 Drawing Sheets

(52) U.S. Cl.
CPC ...... *H02J 7/0071* (2020.01); *H02J 7/007182* (2020.01); *H02J 7/007192* (2020.01)

(56) References Cited

U.S. PATENT DOCUMENTS

| | | | |
|---|---|---|---|
| 6,275,006 B1 | 8/2001 | Koike et al. | |
| 6,304,061 B1 | 10/2001 | Toya | |
| 7,012,405 B2 | 3/2006 | Nishida et al. | |
| 8,421,414 B2 | 4/2013 | Lee et al. | |
| 2003/0076074 A1 | 4/2003 | Kawai | |
| 2004/0067740 A1 | 4/2004 | Handa et al. | |
| 2007/0145954 A1 | 6/2007 | Kawahara et al. | |
| 2009/0315403 A1* | 12/2009 | Ichikawa | B60L 50/16 320/134 |
| 2012/0056590 A1 | 3/2012 | Amiruddin et al. | |
| 2012/0249078 A1 | 10/2012 | Kim et al. | |
| 2013/0049702 A1 | 2/2013 | Dai et al. | |
| 2013/0119939 A1 | 5/2013 | Yonezawa et al. | |
| 2014/0008976 A1* | 1/2014 | Yebka | H02J 7/0047 307/23 |
| 2014/0266069 A1* | 9/2014 | Deboy | H02J 7/00712 320/137 |
| 2015/0069954 A1* | 3/2015 | Kechmire | H02J 7/0047 320/136 |
| 2015/0188327 A1* | 7/2015 | Ogihara | H02J 7/007182 320/137 |
| 2016/0061908 A1 | 3/2016 | Torai et al. | |
| 2016/0072313 A1* | 3/2016 | Satou | H02J 7/007 320/162 |
| 2016/0359345 A1 | 12/2016 | Uesugi | |
| 2017/0214266 A1 | 7/2017 | Takahashi et al. | |
| 2017/0338668 A1 | 11/2017 | Sada et al. | |

FOREIGN PATENT DOCUMENTS

| | | |
|---|---|---|
| CN | 103168383 A | 6/2013 |
| CN | 105388422 A | 3/2016 |
| JP | 11-150884 A | 6/1999 |
| JP | 11-355968 A | 12/1999 |
| JP | 2005-269824 A | 9/2005 |
| JP | 2011-215083 A | 10/2011 |
| JP | 2013-106476 A | 5/2013 |
| JP | 2014-18022 A | 1/2014 |
| JP | 2014-18062 A | 1/2014 |
| JP | 2014-49229 A | 3/2014 |
| KR | 1999-0055238 A | 7/1999 |
| KR | 10-2015-0020257 A | 2/2015 |

OTHER PUBLICATIONS

English Translation of Chinese Office Action Corresponding to Application Serial No. 201780020150.0, dated Jan. 20, 2021, 12 pages.
Partial Supplementary European Search Report for Application No. 17782582.5, dated Aug. 8, 2019, 14 pages.
EPO Extended Search Report dated Dec. 12, 2019, for corresponding European Patent Application No. 17782582.5 (13 pages).
EPO Office Action dated Nov. 11, 2020, issued in corresponding European Patent Application No. 17782582.5 (4 pages).
Watanabe, Shoichiro et al.; "Capacity fading of $LiAl_yNi_{1-x-y}Co_xO_2$ cathode for lithium-ion batteries during accelerated calendar and cycle life tests (effect of depth of discharge in charge-discharge cycling on the suppression of the micro-crack generation of $LiAl_yNi_{1-x-y}Co_xO_2$ particle)"; Journal of Power Sources; 260; 2014; pp. 50-56.
Wu, Jianguo; Charging Principle of Lithium Ion Secondary Battery; Technology for Overhauling Electrical Home Appliance; vol. 6, Jun. 30, 2009, p. 327.
National Intellectual Property Administration, PRC Office Action; Application No. 201780020150.0, dated Sep. 30, 2021, 22 pages (English Translation Included).
Korean Office Action dated Mar. 22, 2023, corresponding to Application No. 10-2016-0044913, 5 pages.
China Office Action (English Translation) Corresponding No. 202110622750.2; issued Sep. 21, 2023; 12 pps.

* cited by examiner

BATTERY CHARGING/DISCHARGING CONTROL DEVICE AND METHOD FOR CONTROLLING SAME

CROSS-REFERENCE TO RELATED APPLICATIONS

This application is a divisional of U.S. patent application Ser. No. 16/091,472, filed Oct. 4, 2018, which is a National Phase Patent Application of International Patent Application No. PCT/KR2017/002963, filed Mar. 20, 2017, which claims priority to and the benefit of Korean Patent Application No. 10-2016-0044913, filed Apr. 12, 2016, the entire content of all of which is incorporated herein by reference.

TECHNICAL FIELD

The present invention relates to a charge and discharge control device of a battery and a control method thereof.

BACKGROUND ART

A battery, which is a secondary battery, repeats the cycle of charge and discharge until the cycle-life runs out. Various charge and discharge control methods are being attempted to extend the cycle-life of such a battery.

In conventional battery charge and discharge control methods, generally, a battery is charged and discharged in the maximum voltage range during the initial use period of the battery, and the voltage use range is gradually reduced as the number of cycles increases.

Such conventional charge and discharge control methods of a battery have drawbacks in that the deterioration phenomenon at the time of battery discharge cannot be improved, and an increase in the thickness of a battery that may occur during the initial use period of the battery cannot be prevented.

DISCLOSURE

Technical Problem

An exemplary embodiment of the present invention provides a battery charge and discharge control device which can improve a deterioration phenomenon that occurs during battery discharge and prevent the phenomenon of increasing a battery thickness that may occur during the initial-use period of the battery, and a control method thereof.

Technical Solution

A battery charge and discharge control device according to an exemplary embodiment includes: a voltage sensor for measuring the voltage of a battery; and a controller, which charges the battery with a constant current in a constant current mode, and is converted to a constant voltage mode when the voltage of the battery measured through the voltage sensor corresponds to an end-of-charge voltage, thereby charging the battery with a constant voltage, wherein the end-of-charge voltage is set as a first end-of-charge voltage minus a negative electrode threshold potential from the full-charge voltage of the battery, and the negative electrode threshold potential is a potential value of the negative electrode where a negative electrode active material contained in the battery causes a phase change.

The control unit measures or calculates the state of charge of the battery, and resets the end-of-charge voltage to the end-of-charge voltage of a second charge when the state of charge is greater than a reference state of charge, and the end-of-charge voltage of the second charge may be lower than the end-of-charge voltage of the first charge.

The control unit may set a cut-off current in the constant voltage mode to be higher than a default value when the size of the constant current in the constant current mode exceeds the size of a reference current.

The control unit, during the discharge period of the battery, stops discharge of the battery when the measured voltage of the battery corresponds to a discharge end voltage, and the end-of-discharge voltage may be a voltage at a time when the slope of the measured voltage exceeds a threshold slope.

A battery charge and discharge control device according to an exemplary embodiment includes: a voltage sensor for measuring the voltage of a battery; and a control unit, which controls the charge and discharge of the battery to ensure that the measured voltage of the battery is within a use range of the voltage corresponding to the use period of the battery, wherein the control unit controls the charge and discharge of the battery by setting the use range of the voltage to be within the use range of a first voltage during the initial-use period, and setting the use range of the voltage to be within the use range of a second voltage during an intermediate-use period; the use range of the voltage corresponds to a voltage difference between an end-of-charge voltage and an end-of-discharge voltage; and the use range of the second voltage is greater than the use range of the first voltage.

The control unit charges and discharges the battery by setting the use range of the voltage to be within the use range of a third voltage during a late-use period, and the use range of the third voltage may be greater than the use range of the second voltage.

The use range of the third voltage may be greater than the use range of the first voltage.

The intermediate-use period may start when the number of charge and discharge cycles of the battery exceeds a certain number of charge and discharge cycles.

The late-use period may start when a measured maximum capacity of the battery becomes a certain ratio of a first maximum capacity of the battery.

The control unit may sequentially increase the end-of-charge voltage and sequentially reduce the end-of-discharge voltage during the intermediate-use period.

When a first full-charge voltage of the battery is FCV, a negative electrode threshold potential is NECV, a deterioration condition is AC, a capacity reduction rate is CRR, a reference end-of-charge voltage is REOC, a first reference end-of-discharge voltage is REOD1, and a second end-of-discharge voltage is REOD2, the end-of-charge voltage (EOC) may be determined according to the equation EOC=REOC+(FCV−NECV−REOC)*CRR/(100−AC); the end-of-discharge voltage (EOD) may be determined according to the equation EOD=REOD1−(REOD1−REOD2)*CRR/(100−AC); the negative electrode threshold potential may be a potential value of the negative electrode where a negative electrode active material contained in the battery causes a phase change; the deterioration condition is a percentage value corresponding to the certain discharge capacity that is reduced relative to the initial discharge capacity of the battery; the capacity reduction rate may be a percentage value corresponding to the difference between the initial discharge capacity and the present discharge capacity of the battery; the reference end-of-charge voltage and the first reference end-of-discharge voltage correspond to the use range of the first voltage; and the second reference end-of-discharge voltage may be lower than the first end-of-discharge voltage.

The use range of the first voltage and the use range of the second voltage may be use ranges of the battery voltage when the temperature corresponds to the reference temperature range, and the control unit increases at least one of the ranges of the first and second voltages used when the temperature is lower than the reference temperature range, and reduces at least one of the ranges of the first and second voltages used when the temperature is higher than a reference temperature range.

A method for controlling charge and discharge of a battery according to an exemplary embodiment includes: setting an end-of-charge voltage of a battery; measuring a voltage of the battery during a constant current mode where the battery is charged with a constant current; and converting the battery to a constant voltage mode where the battery is charged with a constant voltage when the measured voltage of the battery corresponds to the end-of-charge voltage, and in setting the end-of-charge voltage, the end-of-charge voltage is set as a first end-of-charge voltage minus a negative electrode threshold potential from the full-charge voltage of the battery, and the negative electrode threshold potential is a potential value of the negative electrode where a negative electrode active material contained in the battery causes a phase change.

The method for controlling charge and discharge of a battery may further include: measuring or calculating a state of charge of the battery; and resetting the end-of-charge voltage to the end-of-charge voltage of a second charge when the state of charge is greater than a reference state of charge, wherein the end-of-charge voltage of the second charge may be lower than the end-of-charge voltage of the first charge.

The method for controlling charge and discharge of a battery may further include resetting a cut-off current in the constant voltage mode to be higher than a default value when a size of the constant current in the constant current mode exceeds a size of the reference current.

The method for controlling charge and discharge of a battery may further include: measuring the voltage of the battery during a discharge period of the battery; and stopping the discharge of the battery when the voltage of the battery corresponds to an end-of-discharge voltage, wherein the end-of-discharge voltage is a voltage at a time point when a slope of the measured voltage relative to time exceeds a threshold slope.

A method for controlling charge and discharge of a battery according to an exemplary embodiment includes: charging and discharging a battery by having a voltage range of the battery used as a use range of a first voltage, during an initial-use period; and charging and discharging the battery by having the voltage range of the battery used as a use range of a second voltage, during an intermediate-use period, wherein the voltage range used corresponds to a voltage difference between an end-of-charge voltage and an end-of-discharge voltage, and the use range of the second voltage is greater than the use range of the first voltage.

The method for controlling charge and discharge of a battery may include charging and discharging the battery by having the voltage range of the battery used as a use range of a third voltage, during the late-use period, wherein the use range of the third voltage is greater than the use range of the second voltage.

The use range of the third voltage may be greater than the use range of the first voltage.

The intermediate-use period may start when the number of charge and discharge cycles of the battery exceeds a certain number of charge and discharge cycles.

The late-use period may start when a measured maximum capacity of the battery becomes a certain ratio of the first maximum capacity of the battery.

The charging and discharging a battery during the initial-use period may include: sequentially increasing the end-of-charge voltage and sequentially reduces the end-of-discharge voltage; and sequentially reducing the end-of-discharge voltage.

When the first full-charge voltage of the battery is FCV, the negative electrode threshold potential is NECV, the deterioration condition is AC, the capacity reduction rate is CRR, the reference end-of-charge voltage is REOC, the first reference end-of-discharge voltage is REOD1, and the second end-of-discharge voltage is REOD2, the end-of-charge voltage (EOC) may be determined according to the equation EOC=REOC+(FCV−NECV−REOC)*CRR/(100−AC); the end-of-discharge voltage (EOD) may be determined according to the equation EOD=REOD1−(REOD1−REOD2)*CRR/(100−AC); the negative electrode threshold potential is a potential value of the negative electrode where a negative electrode active material contained in the battery causes a phase change; the deterioration condition is a percentage value corresponding to the certain discharge capacity that is reduced relative to the initial discharge capacity of the battery; the capacity reduction rate is a percentage value corresponding to the difference between the initial discharge capacity and the present discharge capacity of the battery; the reference end-of-charge voltage and the first reference end-of-discharge voltage correspond to the use range of the first voltage; and the second reference end-of-discharge voltage may be lower than the first end-of-discharge voltage.

The use range of the first voltage and the use range of the second voltage are the use range of the battery voltage when the temperature corresponds to a reference temperature range, and the method may further include: increasing at least one of the ranges of the first and second voltages used when the temperature is lower than the reference temperature range; and reducing at least one of the ranges of the first and second voltages used when the temperature is higher than the reference temperature range.

When the temperature is higher than the reference temperature range, the end-of-discharge voltage during the intermediate-use period may be lower than the end-of-discharge voltage during the initial-use period.

Advantageous Effects

A charge and discharge control device of a battery and a control method thereof according to an exemplary embodiment can improve a deterioration phenomenon that may occur during the battery discharge and prevent the phenomenon of increasing a battery thickness that may occur during the initial-use period of the battery, and a control method thereof.

MODE FOR INVENTION

Figure 1A:
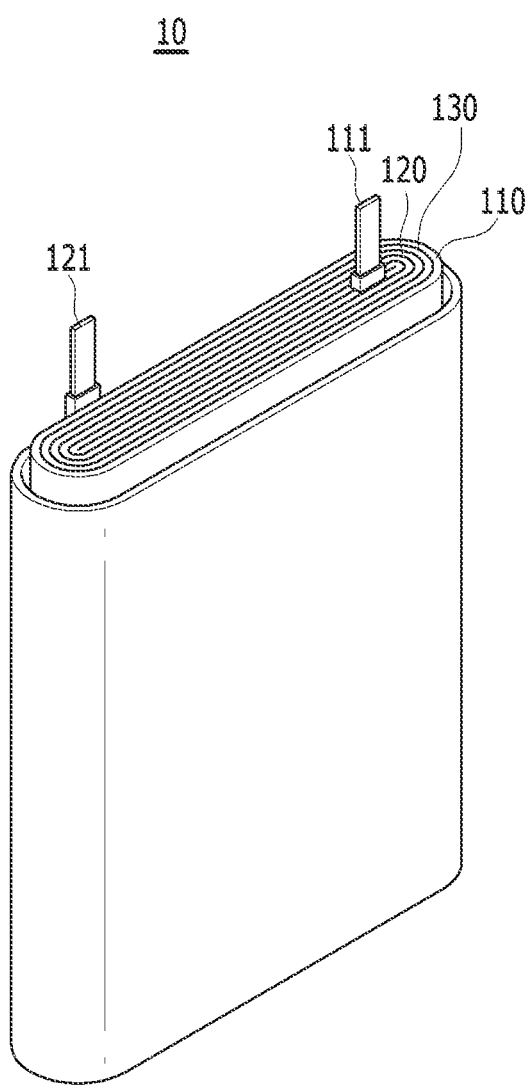
FIG. 1A is a drawing illustrating the configuration of an exemplary battery.

Hereinafter, various exemplary embodiments will be described in detail so that those skilled in the art can easily carry out the present invention with reference to the accompanying drawings. The exemplary embodiments may be implemented in a variety of different forms and are not limited to the exemplary embodiments described herein.

For clear illustration of the exemplary embodiments, parts not related to the description are omitted, and the same reference numerals are used throughout the specification for the same or similar constituent elements. Therefore, the reference numbers of the constituent elements used in previous drawings can be used in following drawings.

In addition, since the size and thickness of each constitution shown in the drawings are arbitrarily shown for convenience of description, the exemplary embodiments are not necessarily limited to those shown. The thicknesses and areas may be exaggerated to clearly represent multiple layers and areas in the drawings.

The method to electrically connect two constituent elements includes not only a direct connection of two components, but also a connection between two components through a different component.

FIG. 1A is a drawing for illustrating the configuration of an exemplary battery.

Referring to FIG. 1A, a battery 10 includes a positive electrode 110, a positive terminal 111 electrically connected to the positive electrode 110, a negative electrode 120, a negative terminal 121 electrically connected to the negative electrode 120, and a separator membrane 130. Although not shown, an electrolyte for the transport of ions may be filled between the positive electrode 110, the negative electrode 120, and the separator membrane 130.

The positive electrode 110 may include a positive current collector and a positive active material layer formed on top of the positive current collector. The positive active material layer may include a positive electrode active material, a binder, and optionally a conductive material.

As the positive current collector, aluminum (Al), nickel (Ni), etc. may be used, but the positive current collector is not limited thereto.

As the positive electrode active material, a compound capable of reversible intercalation and deintercalation of lithium ions may be used. Specifically, at least one kind of a complex oxide or complex phosphate between lithium and a metal selected from cobalt, manganese, nickel, aluminum, iron, and a combination thereof may be used. More specifically, lithium cobalt oxide, lithium nickel oxide, lithium manganese oxide, lithium nickel cobalt manganese oxide, lithium nickel cobalt aluminum oxide, lithium iron phosphate oxide, or a combination thereof may be used.

The binder not only plays a role of well-attaching positive electrode active material particles with each other, but also plays a role of well-attaching the positive electrode active material to the positive current collector. Examples of the binder may include polyvinyl alcohol, carboxymethyl cellulose, hydroxypropylcellulose, diacetylcellulose, polyvinyl chloride, carboxylated polyvinyl chloride, polyvinyl fluoride, an ethylene oxide-containing polymer, polyvinylpyrrolidone, polyurethane, polytetrafluoroethylene, polyvinylidene fluoride, polyethylene, polypropylene, styrene-butadiene rubber, acrylated styrene-butadiene rubber, epoxy resin, nylon, etc., but the binder is not limited thereto. These may be used alone or in combination of two or more.

A conductive material confers conductivity to electrodes, and examples of the conductive material may include natural graphite, artificial graphite, carbon black, carbon fiber, metal powder, metal fiber, etc., but the conductive material is not limited thereto. These may be used alone or in combination of two or more. For the metal powder and the metal fiber, metals such as copper, nickel, aluminum, silver, etc. may be used.

The negative electrode 120 may include a negative current collector and a negative electrode active material layer formed on the negative current collector.

As the negative current collector, copper (Cu), aluminum (Al), gold (Au), nickel (Ni), a copper alloy, etc. may be used, but the negative current collector is not limited thereto.

The negative electrode active material may include a negative electrode active material, a binder, and optionally a conductive material.

As the negative electrode active material, a material capable of reversible intercalation and deintercalation of lithium ions, a material capable of doping and dedoping a lithium metal, an alloy of lithium metals, and lithium, a transition metal oxide, or a combination thereof may be used.

Examples of the material capable of reversible intercalation and deintercalation of lithium ions may include a carbon-based material, such as crystalline carbon, noncrystalline carbon, a combination thereof, etc. Examples of the crystalline carbon may include amorphous, planar, flake, spherical, or fibrous natural graphite or artificial graphite. Examples of the noncrystalline carbon may include soft carbon, hard carbon, mesophase pitch carbide, calcined coke, etc. Examples of the alloy of lithium metals may include alloys between lithium and a metal selected from the group consisting of Na, K, Rb, Cs, Fr, Be, Mg, Ca, Sr, Si, Sb, Pb, In, Zn, Ba, Ra, Ge, Al, and Sn. Examples of the material capable of reversible intercalation and deintercalation of lithium ions may include Si, $SiO_x$ ($0<x<2$), a Si—C complex, a Si—Y alloy, Sn, $SnO_2$, a Sn—C complex, Sn—Y, etc., or additionally, or may be used by combining at least one of these. The atom Y may be selected from the group consisting of Mg, Ca, Sr, Ba, Ra, Sc, Y, Ti, Zr, Hf, Rf, V, Nb, Ta, Db, Cr, Mo, W, Sg, Tc, Re, Bh, Fe, Pb, Ru, Os, Hs, Rh, Ir, Pd, Pt, Cu, Ag, Au, Zn, Cd, B, Al, Ga, Sn, In, TI, Ge, P, As, Sb, Bi, S, Se, Te, Po, and a combination thereof As the transition metal oxide, a vanadium oxide, lithium vanadium oxide, etc. may be used.

The kinds of the binder and conductive material used in the negative electrode 120 may be the same as the binder and the conductive material used in the positive electrode 110.

The positive electrode 110 and the negative electrode 120 may be produced by preparing each active composition by mixing each active material and a binder and optionally a conductive material in a solvent followed by applying each composition on each current collector. In particular, as the solvent, N-methylpyrrolidone, etc. may be used, but the solvent is not limited thereto. Since these preparation methods are widely known in the art, the detailed description thereof will be omitted in the present specification.

The separator membrane 130 separates the negative electrode 120 and the positive electrode 110 and provides a pathway for the transport of lithium ions, and any separator that is conventionally used in lithium batteries may be used. That is, separators which have an excellent electrolyte solution-containing ability while having low resistance to the transport of electrolytic ions may be used. For example, those selected from glass fiber, polyester, polyethylene, polypropylene, polytetrafluoroethylene (PTFE), and a combination thereof and in the form of a woven or non-woven fabric may also be used. For example, polyolefin-based polymer separators such as polyethylene and polypropylene are mainly used for lithium ion batteries, and coated separators containing ceramic or a polymer material may be used to ensure heat resistance or mechanical strength, and optionally, those that are single or multi-layered may be used.

Figure 1B:
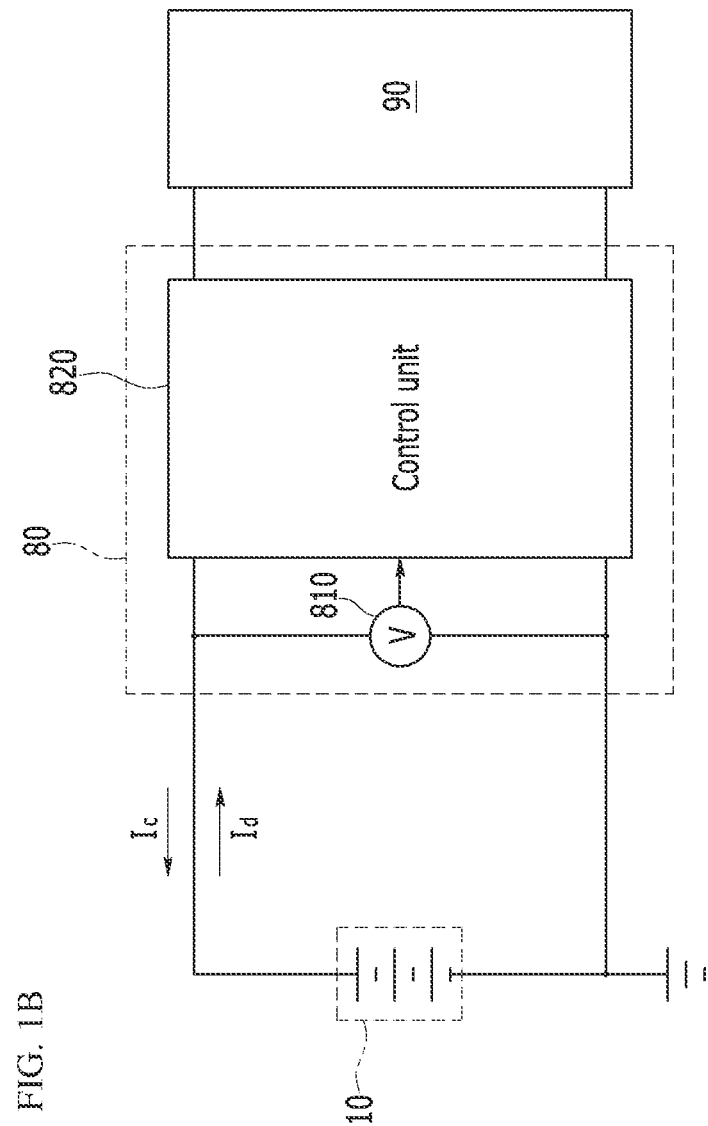
FIG. 1B is a drawing for explaining the charge and discharge control device of a battery according to a first exemplary embodiment.

FIG. 1B is a drawing for explaining the charge and discharge control device of a battery according to a first exemplary embodiment.

Referring to FIG. 1B, a charge and discharge control device 80 is electrically interposed between the battery 10 and a device 90.

The device 90 may be a charger or a power-consuming device. For example, when the device 90 is a charger, the charge and discharge control device 80 may be able to control the charge current ($I_c$), which flows from the charger to the positive terminal 111 of the battery 10. Further, when the device 90 is a power-consuming device such as a motor, etc., the charge and discharge control device 80 may be able to control the discharge current ($I_d$) which flows from the battery 10 to the power-consuming device.

The charge and discharge control device 80 according to an exemplary embodiment may include a voltage sensor 810 and a control unit 820.

The voltage sensor 810 may be configured in such a manner that one end thereof is electrically connected to the positive terminal 111 of the battery 10 while the other end thereof is electrically connected to the negative terminal 121 of the battery 10. The voltage sensor 810 can measure the voltage of a battery using a difference in voltage between the positive electrode potential and the negative electrode potential of the battery, and transfer the measured battery voltage value to the control unit 820.

The control unit 820 can charge the battery 10 with a constant current in a constant current mode, and can be converted to a constant voltage mode when the voltage of the battery 10 measured through the voltage sensor 810 corresponds to an end-of-charge voltage, thereby charging the battery with a constant voltage.

Further, during the discharge period of the battery 10, the control unit 820 can stop the discharge of the battery 10 when the voltage of the battery 10 corresponds to the end-of-discharge voltage.

In the present exemplary embodiment, the control unit 820 can variably set the end-of-charge voltage and the end-of-discharge voltage, thereby preventing the phenomenon of increasing the thickness and extending the life-cycle of the battery 10.

The method for controlling the charge and discharge by the control unit 820 will be explained in more detail with reference to FIGS. 2 to 6B below.

Figure 2:
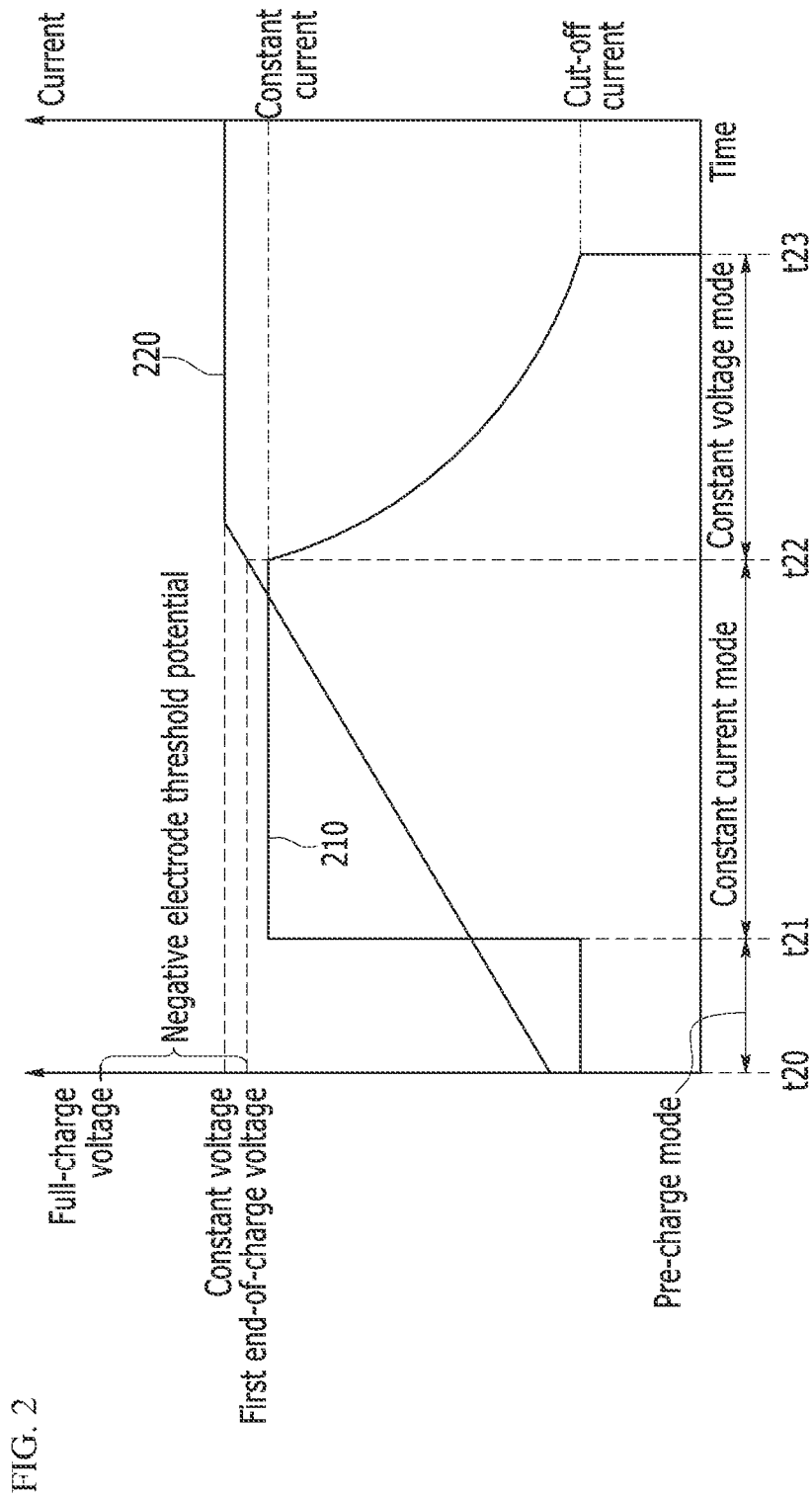
FIG. 2 is a drawing for explaining how to charge a battery according to an exemplary embodiment.

FIG. 2 is a drawing for explaining how to charge a battery according to an exemplary embodiment.

Referring to FIG. 2, graph 20 has a voltage axis and a current axis in the vertical axis and has a time axis in the horizontal axis. A variation in charge current 210 and battery voltage 220 with respect to time will be described below. The charge current 210 refers to a size of the current that flows from the charger of the battery 10 toward the positive terminal 111, and the battery voltage 220 refers to the difference between the potential of the positive electrode 110 and the potential of the negative electrode 120. The battery voltage 220 can be measured through the voltage sensor 810 described above.

The method for charging of the present exemplary embodiment may include a pre-charge mode, a constant current mode, and a constant voltage mode.

First, at the time point of t20, the battery 10 can be slowly charged by receiving an input of a charge current 210 having a low current level in the pre-charge mode. When the battery voltage 220 is very low because the battery 10 has not been used for a long time, the pre-charge mode may be used.

At the time point of t21 when the battery voltage 220 has reached a certain level or higher, the constant current mode may begin. The battery 10 is charged by receiving an input of the charge current 210, which is a constant current having a constant size, in the constant current mode. Accordingly, the battery voltage 220 gradually increases, and the constant current mode terminates at the time point of t22 when the battery voltage 220 corresponds to the end-of-charge voltage.

In FIG. 2, the end-of-charge voltage is expressed as a first end-of-charge voltage. The end-of-charge voltage of the battery 10 may be preset. The first end-of-charge voltage of the present exemplary embodiment is a voltage minus a negative electrode threshold potential from the full-charge voltage of the battery 10. The full-charge voltage of the battery 10 refers to a voltage difference between a positive electrode potential and a negative electrode potential when the state of charge (SOC) of the battery 10 reached the acceptable maximum capacity of the battery, that is, when the charge state of charge is 100%. The full-charge voltage of the battery 10 may be determined based on the full-charge voltage of the battery 10 at the initial stage. For example, when the full-charge voltage is 4.35 V and the negative electrode threshold potential is 0.05 V, the first end-of-charge voltage may be set to approximately 4.3 V.

The negative electrode threshold potential may be a potential value where a negative electrode active material contained in the battery 10 causes a phase change. The phase change of the negative electrode active material occurs when the negative electrode potential becomes lower than the negative electrode threshold potential during the charge process, so the structure where the lithium ions attach to the constituent elements of the negative electrode active material vary thereby causing the expansion (swelling) of the negative electrode 120. That is, when the structure between the constituent elements of a negative electrode active material and lithium ions when the negative electrode potential becomes higher than the negative electrode threshold potential is assigned as the first structure, and when the structure between the constituent elements of a negative electrode active material and lithium ions when the negative electrode potential becomes lower than the negative electrode threshold potential is assigned as the second structure, the expansion of the negative electrode 120 may occur in the second structure. Accordingly, it is desirable to maintain the negative electrode potential above the negative electrode threshold potential so as to maintain the first structure. The negative electrode threshold potential may vary depending on the specification of a battery, but may be in a range from approximately 0.05 V to 0.08 V.

As the battery 10 is charged, the positive electrode potential increases and the negative electrode potential decreases, thereby increasing the battery voltage 220 which is the difference of a voltage between the positive electrode potential and the negative electrode potential. According to the present exemplary embodiment, the battery voltage 220 increases up to the first end-of-charge voltage, and thus the final negative electrode potential can be maintained at a level of the negative electrode threshold potential or higher thereby being capable of preventing the expansion of the negative electrode 120. Since the expansion of the negative electrode 120 can be prevented, the phenomenon of increasing the total thickness of the battery 10 can be prevented.

At the time point of t22 when the battery voltage 220 reaches the first end-of-charge voltage, a constant voltage mode where the positive terminal and the negative terminal 121 of a battery are applied with a constant voltage starts. The constant voltage may be substantially the same as the end-of-charge voltage.

As the battery voltage 220 is maintained as a constant voltage, the charge current 210 continuously decreases, and at the time point of t23 when the reduced charge current 210 reaches the cut-off current, the charge of the battery 10 is considered to be completed such that the supply of the charge current 210 is stopped.

In another exemplary embodiment, the end-of-charge voltage may be reset to a second end-of-charge voltage. First, with regard to the fully-charged battery 10, the state of charge (SOC) of the battery 10 can be determined by measurement or calculation. In the calculation of the state of charge (SOC) of the battery 10, conventional methods for determining state of charge (SOC), such as voltage measurement, current measurement, internal resistance calculation, temperature measurement, etc. may be used. When the measured state of charge (SOC) of the battery 10 exceeds the reference state of charge (SOC) (e.g., 90%), the end-of-charge voltage may be reset as a second end-of-charge voltage. In particular, the second end-of-charge voltage may be lower than the first end-of-charge voltage. The second end-of-charge voltage may be set so that the state of charge (SOC) becomes approximately 85% when the battery 10 is fully charged. For example, when the first end-of-charge voltage is 4.3 V, the second end-of-charge voltage may be set to 4.25 V.

In another exemplary embodiment, the cut-off current may be set to be higher than the default value. For example, since the battery voltage 220 rapidly increases when the constant current in the constant current mode exceeds the size of the reference current, the end-of-charge voltage is set as the first end-of-charge voltage but the cut-off current is set to be higher than the default value so that the supply of the charge current 210 can be terminated earlier. For example, when the constant current exceeds 0.5 C, which is the reference current, and the default value of the cut-off current is 0.02 C, the cut-off current may be reset to approximately 0.3 C. The unit C refers to C-rate.

In exemplary embodiments described above, commonly, the state of charge (SOC) of the fully-charged battery 10 may be set to be maintained at approximately an 85% level. Accordingly, the negative electrode potential of the battery 10 can be maintained to be the same as or higher than the negative electrode threshold potential. Further, the side reaction with an electrolyte solution can be minimized by reducing the occurrence of Li plating and reducing the generation of cracks and pores by preventing the destruction of the structure of the positive electrode active material.

Figure 3:
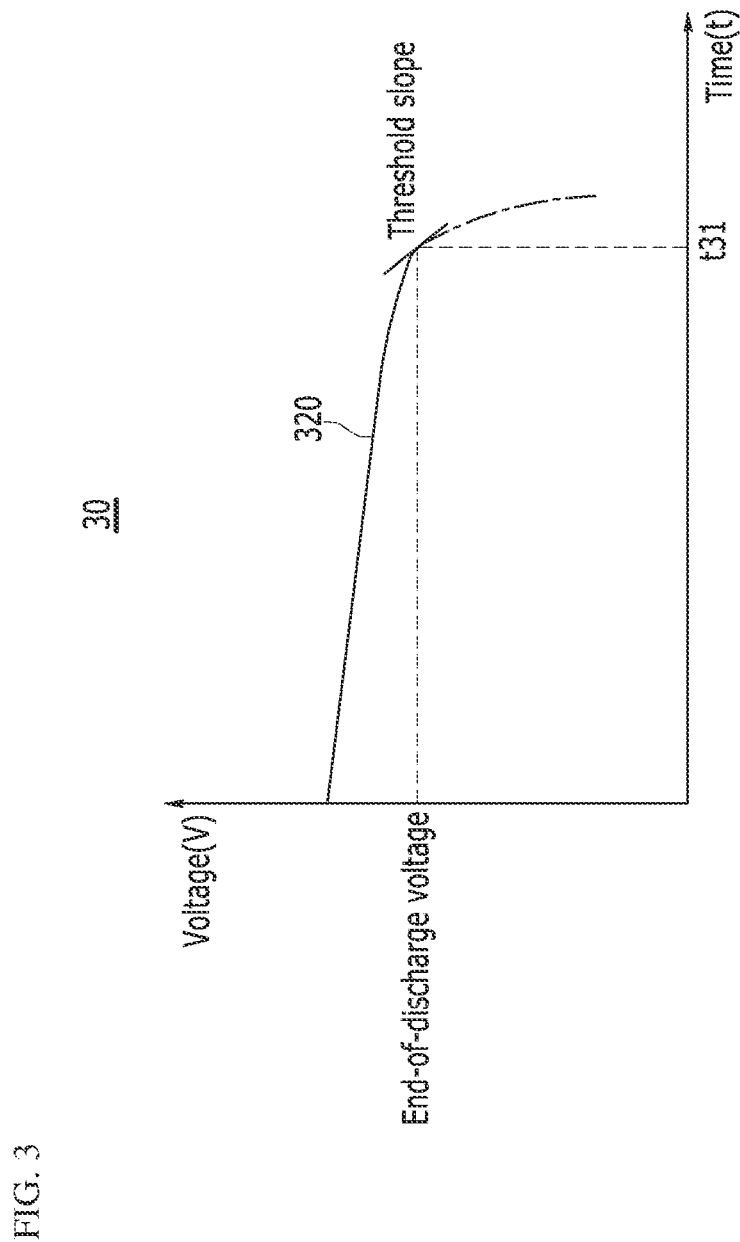
FIG. 3 is a drawing for explaining how to discharge a battery according to an exemplary embodiment.

FIG. 3 is a drawing for explaining how to discharge a battery according to an exemplary embodiment.

Referring to FIG. 3, a graph 30 has a voltage axis in the vertical axis and has a time axis in the horizontal axis. In the graph 30, a change of battery voltage 320 over time is illustrated.

First, the battery voltage 320 is measured during a discharge period. The measurement of the voltage of the battery 10 can easily be performed through the voltage sensor 810 described above. At the time point of t31 when the measured battery voltage 320 corresponds to the end-of-discharge voltage, the discharge of the battery may be stopped.

In the present exemplary embodiment, the end-of-discharge voltage may be set as the voltage at the time point when the slope of the measured battery voltage 320 relative to time exceeds a threshold slope. It can be confirmed that the internal resistance rapidly increases and the battery voltage 320 rapidly decreases at the time point of t31. In order to suppress such an increase of internal resistance and the change in the structure of the negative electrode active material, the battery 10 may be controlled to be discharged within a range in which the slope of the battery voltage 320 relative to time does not exceed the threshold slope. In particular, the slope value refers to the absolute value of the slope.

Figure 4:
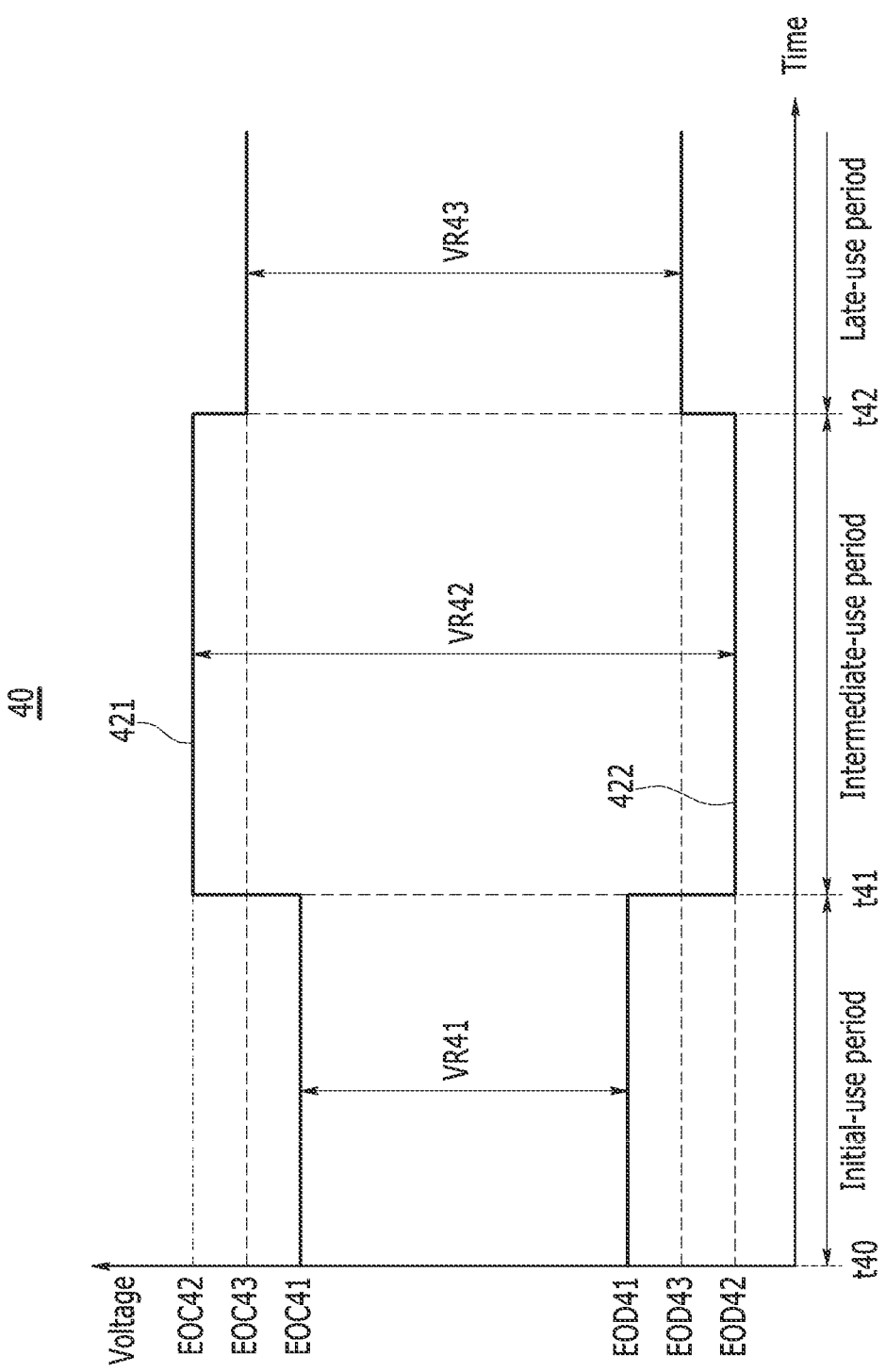
FIG. 4 is a drawing illustrating the voltage range of a battery according to a use period according to an exemplary embodiment.

FIG. 4 is a drawing illustrating the voltage range of a battery according to the use period according to an exemplary embodiment.

Referring to FIG. 4, a graph 40 has a voltage axis in the vertical axis and has a time axis in the horizontal axis. An end-of-charge voltage 421 and an end-of-discharge voltage 422 may be set differently according to the initial-use period, intermediate-use period, and late-use period.

The initial-use period of the battery 10 may be a period between the time point of t40 and the time point of t41, the intermediate-use period may be a period between the time point of t41 and the time point of t42, and the late-use period may be a period after the time point of t42.

During the initial-use period of the battery 10, the battery may be charged and discharged by setting the use range of the voltage of the battery 10 to VR41, which is the use range of the first voltage. During the intermediate-use period of the battery 10, the battery may be charged and discharged by setting the use range of the voltage of the battery 10 to VR42, which is the use range of the second voltage. During the late-use period of the battery 10, the battery may be charged and discharged by setting the use range of the voltage of the battery 10 to VR43, which is the use range of the third voltage. In the present exemplary embodiment, the use range of the voltage corresponds to a difference in voltage between the end-of-charge voltage 421 and the end-of-discharge voltage 422.

For example, during the initial-use period, the end-of-charge voltage 421 of the battery 10 may be set as the first end-of-charge voltage or the second end-of-charge voltage according to the exemplary embodiment of FIG. 2, and the end-of-discharge voltage 422 may be set as the end-of-discharge voltage according to the exemplary embodiment of FIG. 3. As such, during the predetermined initial-use period, the end-of-charge voltage 421 can have a voltage level of EOC41 and the end-of-discharge voltage 422 may have a voltage level of EOD41. The use range of the first voltage, VR41, becomes the difference between the voltage level EOC41 and the voltage level EOD41. As described above, when the battery 10 is charged and discharged in the use range of the first voltage, VR41, the expansion of the negative electrode 120 can be prevented, thereby being capable of preventing the phenomenon of the initial increase of the thickness of the battery 10.

In the present exemplary embodiment, the use range of the second voltage, VR42, may be larger than the use range of the first voltage, VR41. According to the experimental results shown below, the phenomenon of the initial increase of the thickness of the battery 10 decreases during the intermediate-use period after the time point of t41, and thus, even if the use range of the second voltage, VR42, is increased to be larger than the use range of the first voltage, VR41, it would not be a big problem with regard to the battery thickness.

According to the experimental results, in the battery 10 where the end-of-charge voltage was set to 4.35 V and the end-of-discharge voltage was set to 3.0 V, the increase of thickness was 0% when the number of charge and discharge cycles was 0; the increase of thickness was 1.12% when the number of charge and discharge cycles was 1; the increase of thickness was 5.99% when the number of charge and discharge cycles was 50; the increase of thickness was 5.99% when the number of charge and discharge cycles was 150; the increase of thickness was 5.99% when the number of charge and discharge cycles was 200; the increase of thickness was 7.12% when the number of charge and discharge cycles was 250; and the increase of thickness was 8.61% when the number of charge and discharge cycles was 300.

Further, in a battery with the same standard where the end-of-charge voltage was set to 4.2 V and the end-of-discharge voltage was set to 3.4 V, the increase of thickness was 0% when the number of charge and discharge cycles was 0; the increase of thickness was 1.50% when the number of charge and discharge cycles was 1; the increase of thickness was 3.76% when the number of charge and discharge cycles was 50; the increase of thickness was 3.38% when the number of charge and discharge cycles was 150; the increase of thickness was 4.14% when the number of charge and discharge cycles was 200; the increase of thickness was 4.14% when the number of charge and discharge cycles was 250; and the increase of thickness was 4.14% when the number of charge and discharge cycles was 300.

According to the experimental results described above, the thickness increasing phenomenon of the battery 10 was significantly reduced when the number of charge and discharge cycles was approximately 50, and thus, the time point of t41 may be set to be approximately when the number of charge and discharge cycles was approximately 50. The number of charge and discharge cycles that determines the time point of t41 may vary depending on the standard and use environments of the battery 10 and it may be in the range of approximately 15 to 50.

Accordingly, the user may use the battery 10 within the use range VR42 between the voltage level EOC42 and the voltage level EOD42, and may experience improved performance while the thickness is maintained.

Additionally, according to the experimental results described above, it can be confirmed that the initial thickness increasing phenomenon and the final thickness increase of the battery 10 can be prevented by reducing the use range of the first voltage, VR41.

The late-use period of the battery 10 may start from the time point of t42. The use range of the third voltage, VR43, during the late-use period is the difference between the voltage level of EOC43 and the voltage level of EOD43.

The use range of the third voltage, VR43, may be smaller than the use range of the second voltage, VR42. As such, the phenomenon of increasing thickness during the late period of the cycle-life of the battery 10 can be prevented. In particular, the use range of the third voltage, VR4, may be the same as the use range of the first voltage, VR41. Further, in still another exemplary embodiment, the use range of the third voltage, VR43, may be larger than the use range of the first voltage, VR41.

In an exemplary embodiment, the time point t42 may be determined as the time when the measured maximum capacity of the battery 10 becomes a certain ratio of the first maximum capacity of the battery 10. For example, when the measured maximum capacity of the battery 10 at a certain time point is 90% of the first maximum capacity of the battery 10, the certain time point may be determined as the time point t42.

Figure 5:
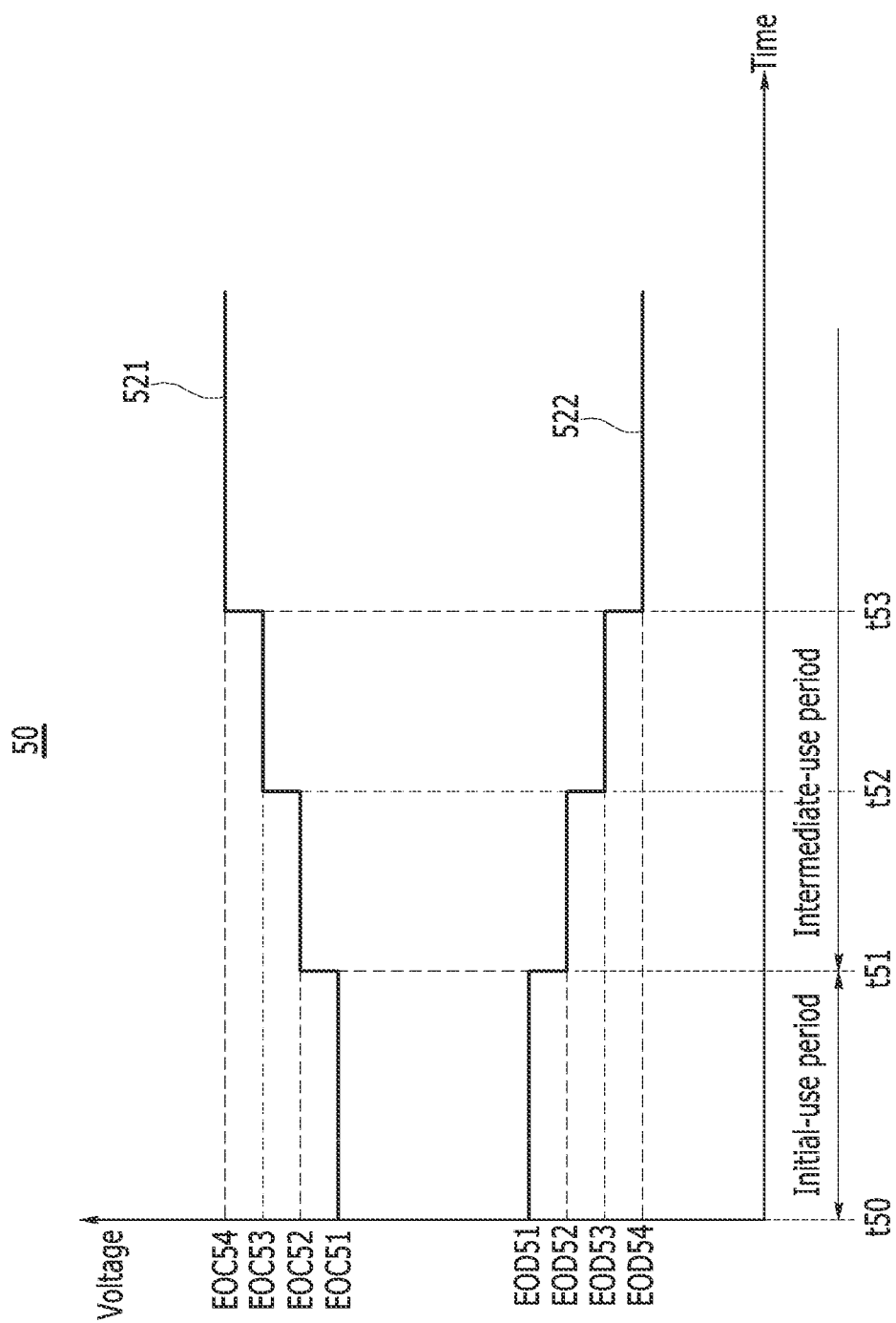
FIG. 5 is a drawing illustrating the voltage range of a battery according to the intermediate-use period according to an exemplary embodiment.

FIG. 5 is a drawing illustrating the voltage range of a battery according to the intermediate-use period according to an exemplary embodiment.

Referring to FIG. 5, a graph 50 has a voltage axis in the vertical axis and has a time axis in the horizontal axis. The period from the time point t50 to the time point t51 is the initial-use period of the battery 10, and the period after the time point t51 is the intermediate-use period of the battery 10. The definitions of the initial-use period and the intermediate-use period and the distinction between the two periods are the same as described in the exemplary embodiment of FIG. 4.

The difference between the exemplary embodiment of FIG. 5 and the exemplary embodiment of FIG. 4 lies in the intermediate-use period. In charging and discharging the battery 10 during the intermediate-use period in the exemplary embodiment of FIG. 5, an end-of-charge voltage 521 is sequentially increased and an end-of-discharge voltage 522 is sequentially decreased according to time.

For example, when the end-of-charge voltage 521 has the voltage level EOC51 and the end-of-discharge voltage 522 has the voltage level EOD51 during the initial-use period, the end-of-charge voltage 521 may have the voltage level EOC52 and the end-of-discharge voltage 522 may have the voltage level EOD52 during the intermediate-use period of the time point t51 to the time point t52; the end-of-charge voltage 521 may have the voltage level EOC53 and the end-of-discharge voltage 522 may have the voltage level EOD53 during the intermediate-use period of the time point t52 to the time point t53; and the end-of-charge voltage 521 may have the voltage level EOC54 and the end-of-discharge voltage 522 may have the voltage level EOD54 during the intermediate-use period after the time point t53. The voltage level of the end-of-charge voltage 521 may increase in the order of the voltage level EOC51, the voltage level EOC52, the voltage level EOC53, and the voltage level EOC54. The voltage level of the end-of-discharge voltage 522 may decrease in the order of the voltage level EOD51, the voltage level EOD52, the voltage level EOD53, and the voltage level EOC54.

According to an exemplary embodiment, when the first full-charge voltage of the battery 10 is FCV, the negative electrode threshold potential is NECV, the deterioration condition is AC, the capacity reduction rate is CRR, the reference end-of-charge voltage is REOC, the first reference end-of-discharge voltage is REOD1, and the second end-ofdischarge voltage is REOD2, the end-of-charge voltage (EOC) 521 may be determined according to the following Equation 1.

$$EOC = REOC + (FCV - NECV - REOC) * CRR / (100 - AC) \quad \text{[Equation 1]}$$

Further, the end-of-discharge voltage (EOD) 522 may be determined according to the following Equation 2.

$$EOD = REOD1 - (REOD1 - REOD2) * CRR / (100 - AC) \quad \text{[Equation 2]}$$

In particular, the negative electrode threshold potential may be a potential value of the negative electrode 120 where a negative electrode active material contained in the battery 10 causes a phase change. The deterioration condition may be a percentage value corresponding to the certain discharge capacity that is reduced relative to the initial discharge capacity of the battery 10. The capacity reduction rate may be a percentage value corresponding to the difference between the initial discharge capacity and the present discharge capacity of the battery 10. The reference end-of-charge voltage and the first reference end-of-discharge voltage may correspond to the use range of the first voltage. The second reference end-of-discharge voltage may be lower than the first end-of-discharge voltage.

Equations 1 and 2 described above will be explained using specific examples below.

The use range of the first voltage refers to the use range of the voltage during the initial-use period, and thus, the voltage level of the reference end-of-charge voltage in the present exemplary embodiment corresponds to the voltage level EOC51. Further, the first reference end-of-discharge voltage corresponds to the voltage level EOD51. For example, the reference end-of-charge voltage may be 4.2 V and the first reference end-of-discharge voltage may be 3.4 V. The second reference end-of-discharge voltage may be 3.0 V. The second reference end-of-discharge voltage may be determined with the end-of-discharge voltage based on a battery pack.

Referring to the exemplary embodiment of FIG. 2, the negative electrode threshold potential may be approximately 0.05 V. The first full-charge voltage of the battery 10 may be 4.35 V. The deterioration condition may be 80%. The capacity reduction rate may be measured based on a 5% capacity reduction, for example, 5%, 10%, and 15%.

When the 5% capacity reduction occurs at the time point of t51, according to Equations 1 and 2, the voltage level EOC52 of the increased end-of-charge voltage 521 is 4.225 V and the voltage level EOD52 of the reduced end-of-discharge voltage 522 is 3.3 V.

When the 10% capacity reduction occurs at the time point of t52, according to Equations 1 and 2, the voltage level EOC53 of the increased end-of-charge voltage 521 is 4.25 V and the voltage level EOD53 of the reduced end-of-discharge voltage 522 is 3.2 V.

When the 15% capacity reduction occurs at the time point of t53, according to Equations 1 and 2, the voltage level EOC54 of the increased end-of-charge voltage 521 is 4.275 V and the voltage level EOD54 of the reduced end-of-discharge voltage 522 is 3.1 V.

According to the methods for controlling charging and discharging described above, the user may experience that the capacity of the battery 10 is consistent even if a substantial reduction in the capacity of the battery 10 occurs.

According to an exemplary embodiment, to prevent a rapid decrease of the discharge capacity with regard to the period after the time point of t53, the deterioration may be controlled to be suppressed by fixing the end-of-charge voltage 521 and the end-of-discharge voltage 522.

Equations 1 and 2 described above are simply an embodiment for implementing the exemplary embodiment of FIG. 5, and the present exemplary embodiment is not limited by these equations.

Figure 6A:
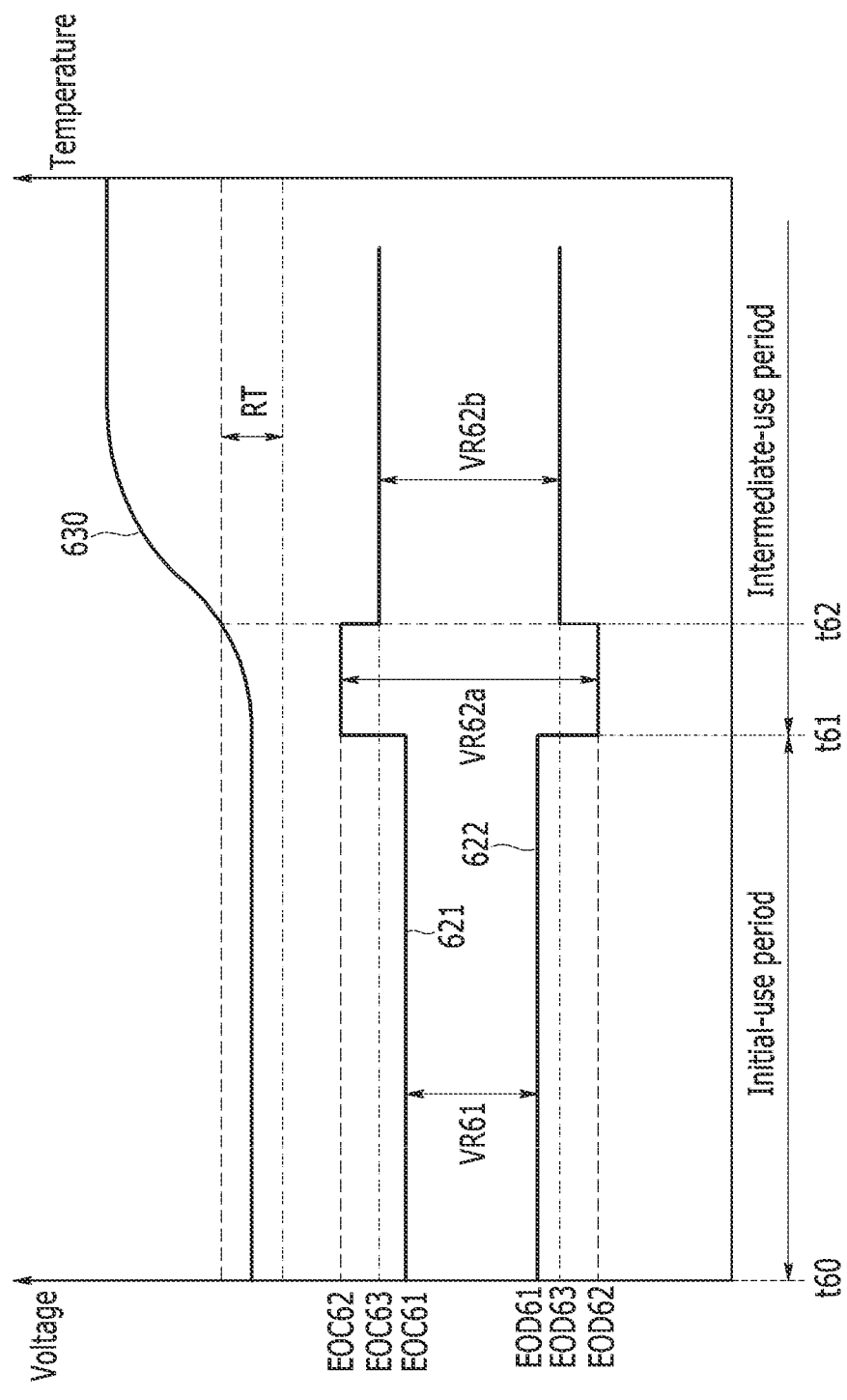
FIG. 6A is a drawing illustrating the voltage range of a battery according to a temperature increase according to an exemplary embodiment.

FIG. 6A is a drawing illustrating the voltage range of a battery according to the temperature increase according to an exemplary embodiment.

Referring to FIG. 6A, a graph 60 has a voltage axis and a temperature axis in the vertical axis and has a time axis in the horizontal axis. The period from the time point of t60 to the time point t61 is the initial-use period, and the period after the time point t61 is the intermediate-use period. The definitions of the initial-use period and the intermediate-use period and the distinction between the two periods are the same as described in the exemplary embodiment of FIG. 4.

In the exemplary embodiment of FIG. 6A, during the initial-use period the battery 10 is charged and discharged in the use range of the first voltage, VR61, whereas during the intermediate-use period the battery 10 is charged and discharged in the use range of the second voltage, VR62a and VR62b. The use range of the first voltage, VR61, is determined according to the voltage level EOC61 and the voltage level EOD61; the use range of the second voltage, VR62a, is determined according to the voltage level EOC62 and the voltage level EOD62; and the use range of the second voltage, VR62b, is determined according to the voltage level EOC63 and the voltage level EOD63.

The use range of the first voltage, VR61, and the use range of the second voltage, VR62a, are the use ranges of the battery 10 when a temperature 630 corresponds to the reference temperature range (RT), whereas the use range of the second voltage, VR62b, is the use range of the battery 10 when the temperature 630 is higher than the reference temperature range (RT). The reference temperature range (RT) may be a range of room temperature (ordinary temperature), and the range of room temperature may be determined to be in the range of approximately 15 degrees to 35 degrees Celsius.

At the time point of t62 when the temperature 630 becomes higher than the reference temperature range (RT), the discharge capacity of the battery 10 increases relative to that at room temperature. Therefore, an end-of-charge voltage 621 may be lowered from the voltage level EOC62 to the voltage level EOC63 and an end-of-discharge voltage 622 may be increased from the voltage level EOD62 to the voltage level EOD63. Accordingly, the battery 10 is charged and discharged in the use range of the second voltage, VR62b, where the voltage is reduced compared to the use range of the second voltage, VR62a. Accordingly, the side reaction rate of the internal active material can be reduced thereby being able to obtain an effect of increasing the cycle-life of the battery.

Although not shown, the same principle may apply even when the temperature 630 becomes higher than the reference temperature range (RT) during the initial-use period. That is, the use range of the first voltage, VR61, may be reduced compared to that of room temperature.

According to an exemplary embodiment, when the temperature 630 becomes higher than the reference temperature range (RT), the altered voltage level EOD63 of the end-of-discharge voltage 622 during the intermediate-use period may be lower than the voltage level EOD61 of the end-of-discharge voltage 622 during the initial-use period. Additionally, when the temperature 630 becomes higher than the reference temperature range (RT), the altered voltage level EOD63 of the end-of-charge voltage 621 during the intermediate-use period may be higher than the end-of-charge voltage 621 during the initial-use period. That is, the use ranges of the second voltage, VR62a and VR62b, during the intermediate-use period may be controlled to always be larger than the use range of the first voltage, VR61, during the initial-use period, regardless of the change in temperature. By doing so, the effect of the exemplary embodiment according to FIG. 4 can be obtained while being capable of controlling the use range of the second voltage in response to the change in temperature according to the exemplary embodiment of FIG. 6A.

Figure 6B:
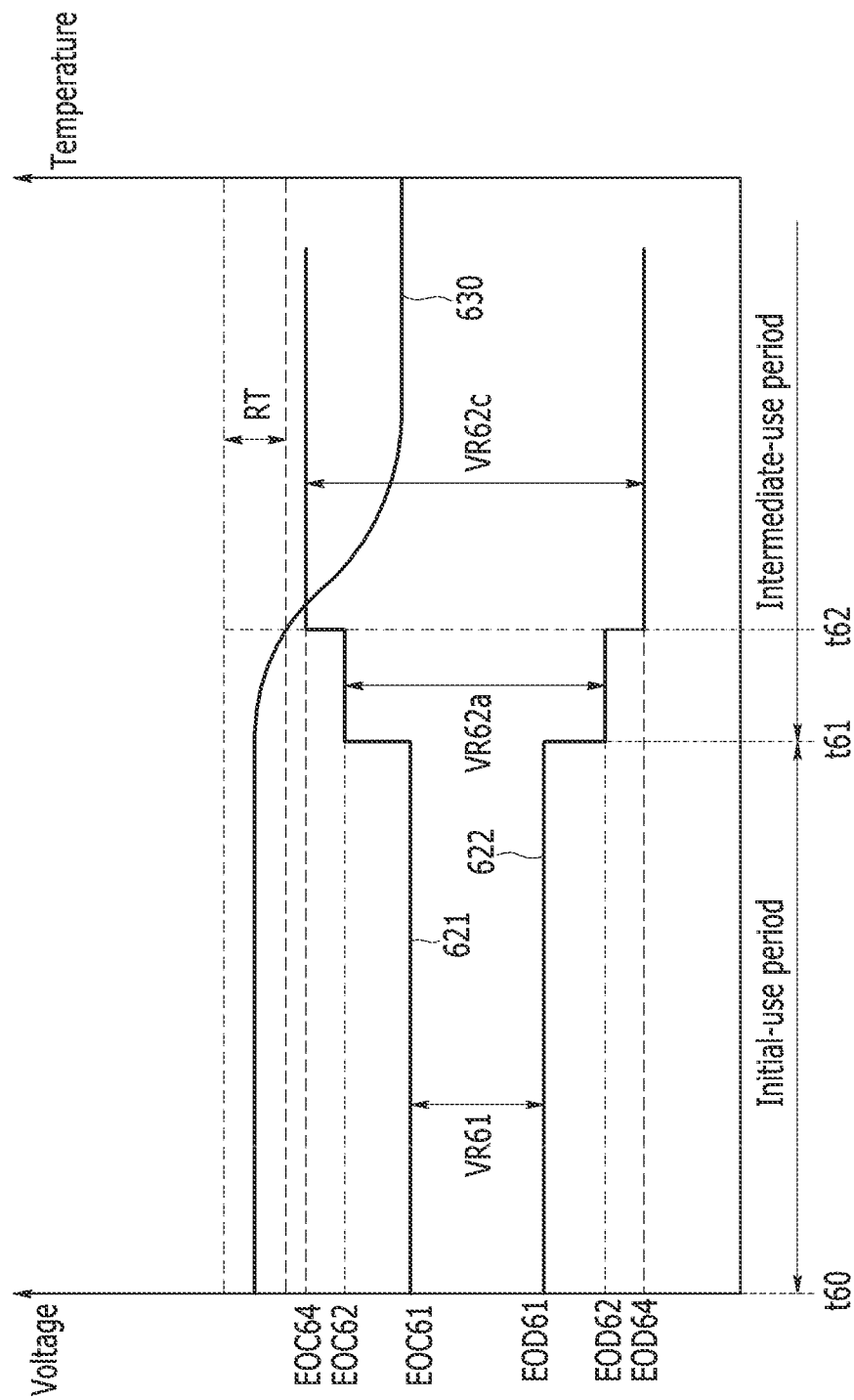
FIG. 6B is a drawing illustrating the voltage range of a battery according to a temperature decrease according to an exemplary embodiment.

FIG. 6B is a drawing illustrating the voltage range of a battery according to the temperature decrease according to an exemplary embodiment.

Comparing FIG. 6B with FIG. 6A, the temperature 630 is lower than the reference temperature range (RT) at the time point of t62. When the temperature 630 is lower than the reference temperature range (RT), the discharge capacity of the battery 10 is reduced compared to that of room temperature, and to compensate the reduction, the use range of the voltage may be increased.

Accordingly, the end-of-charge voltage 621 may be increased from the voltage level EOC62 to the voltage level EOC64 and the end-of-discharge voltage 622 may be decreased from the voltage level EOD62 to the voltage level EOD64. Accordingly, the battery 10 is charged and discharged in the use range of the second voltage, VR62c, where the voltage is increased compared to the use range of the second voltage, VR62a.

Although not shown, the same principle may apply even when the temperature 630 becomes lower than the reference temperature range (RT) during the initial-use period. That is, the use range of the first voltage, VR61, may be increased compared to that of room temperature.

The detailed description of the invention described in the drawings and described above is merely illustrative of the present invention, and it is used only for the purpose of describing the present invention and not for restricting the meanings or limiting the scope of the present invention described in the claims. It will therefore be apparent to those skilled in the art that numerous variations and equivalents of other embodiments are possible. Therefore, the true technical protection scope of the present invention should be determined by the technical concepts of the accompanying claims.

What is claimed is:

1. A battery charge and discharge control device, comprising:
   a voltage sensor for measuring a voltage of a battery; and
   a controller for charging the battery with a constant current in a constant current mode, for converting from the constant current mode to a constant voltage mode when the voltage of the battery measured through the voltage sensor corresponds to an end-of-charge voltage, and for charging the battery with a constant voltage in the constant voltage mode,
   wherein the end-of-charge voltage is set as a-first end-of-charge voltage and the first end-of-charge voltage is a voltage minus a negative electrode threshold potential from a full-charge voltage of the battery,
   the negative electrode threshold potential is a potential value of a negative electrode where a negative electrode active material contained in the battery causes a phase change, and
   the phase change of the negative electrode active material occurs when a negative electrode potential of the battery becomes lower than the negative electrode threshold potential during a charge process, and causes expansion of the negative electrode occurs due to a change in a structure of lithium ions binding to constituent elements of the negative electrode active material.

2. The battery charge and discharge control device of claim 1, wherein:
   the controller is configured to measure or calculate a state of charge of the battery, and is configured to reset the end-of-charge voltage to a second end-of-charge voltage when the state of charge is greater than a reference state of charge; and
   the second end-of-charge voltage is lower than the first end-of-charge voltage.

3. The battery charge and discharge control device of claim 1, wherein the controller is configured to set a cut-off current in the constant voltage mode to be higher than a default value when a size of the constant current in the constant current mode exceeds a size of a reference current.

4. The battery charge and discharge control device of claim 2, wherein:
   the controller, during a discharge period of the battery, is configured to stop discharge of the battery when the measured voltage of the battery corresponds to a discharge end voltage; and
   an end-of-discharge voltage is at a time when a slope of the measured voltage exceeds a threshold slope.

5. A method for controlling charge and discharge of a battery, comprising:
   setting an end-of-charge voltage of the battery to a first end-of-charge voltage;
   measuring a voltage of the battery during a constant current mode where the battery is charged with a constant current; and
   converting the battery to a constant voltage mode for charging the battery with a constant voltage when the measured voltage of the battery corresponds to the end-of-charge voltage,
   wherein the first end-of-charge voltage is a voltage minus a negative electrode threshold potential from a full-charge voltage of the battery,
   wherein the negative electrode threshold potential is a potential value of a negative electrode where a negative electrode active material contained in the battery causes a phase change, and
   wherein the phase change of the negative electrode active material occurs when a negative electrode potential of the battery becomes lower than the negative electrode threshold potential during a charge process, and causes expansion of the negative electrode occurs due to a change in a structure of lithium ions binding to constituent elements of the negative electrode active material.

6. The method for controlling charge and discharge of the battery of claim 5, further comprising:
   measuring or calculating a state of charge of the battery; and
   resetting the end-of-charge voltage to a second end-of-charge voltage when the state of charge is greater than a reference state of charge,
   wherein the second end-of-charge voltage is lower than the first end-of-charge voltage.

7. The method for controlling charge and discharge of the battery of claim 5, further comprising resetting a cut-off current in the constant voltage mode to be higher than a default value when a size of the constant current in the constant current mode exceeds a size of a reference current.

8. The method for controlling charge and discharge of the battery of claim 6, further comprising:
- measuring the voltage of the battery during a discharge period of the battery; and
- stopping the discharge of the battery when the voltage of the battery corresponds to an end-of-discharge voltage,
- wherein the end-of-discharge voltage is a voltage at a time point when a slope of the measured voltage relative to time exceeds a threshold slope.

* * * * *

UNITED STATES PATENT AND TRADEMARK OFFICE
CERTIFICATE OF CORRECTION

| | | |
|---|---|---|
| PATENT NO. | : 12,015,297 B2 | Page 1 of 1 |
| APPLICATION NO. | : 17/694459 | |
| DATED | : June 18, 2024 | |
| INVENTOR(S) | : Yongheui Song et al. | |

It is certified that error appears in the above-identified patent and that said Letters Patent is hereby corrected as shown below:

In the Claims

In Column 15, Line 56, in Claim 1, delete "a-first" and insert -- a first --.

Signed and Sealed this
Nineteenth Day of November, 2024

Katherine Kelly Vidal
*Director of the United States Patent and Trademark Office*